US009276762B2

(12) United States Patent
Godau et al.

(10) Patent No.: US 9,276,762 B2
(45) Date of Patent: Mar. 1, 2016

(54) METHOD FOR ALLOCATING SUBSCRIBER ADDRESSES TO BUS SUBSCRIBERS OF A BUS-BASED CONTROL SYSTEM

(71) Applicant: Pilz GmbH & Co. KG, Ostfildern (DE)

(72) Inventors: Thorsten Godau, Ostfildern (DE); Michael Haerter, Ostfildern (DE); Dietmar Seizinger, Ostfildern (DE); Reiner Haueisen, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 301 days.

(21) Appl. No.: 13/769,444

(22) Filed: Feb. 18, 2013

(65) Prior Publication Data

US 2013/0166799 A1 Jun. 27, 2013

Related U.S. Application Data

(63) Continuation of application No. PCT/EP2011/063416, filed on Aug. 4, 2011.

(30) Foreign Application Priority Data

Aug. 19, 2010 (DE) ........................ 10 2010 035 771

(51) Int. Cl.
*H04L 12/28* (2006.01)
*H04L 12/40* (2006.01)
(Continued)

(52) U.S. Cl.
CPC .......... *H04L 12/40019* (2013.01); *G06F 13/42* (2013.01); *H04L 29/12254* (2013.01); *H04L 61/2038* (2013.01); *H03M 13/09* (2013.01); *H04L 2012/4026* (2013.01)

(58) Field of Classification Search
USPC .......................................... 370/254; 710/107
See application file for complete search history.

(56) References Cited

U.S. PATENT DOCUMENTS 5,872,524 A * 2/1999 Iida ............................ 340/9.16
6,216,172 B1 * 4/2001 Kolblin et al. ................ 709/253
(Continued)

FOREIGN PATENT DOCUMENTS

CN 101374094 2/2009
DE 3736081 A1 * 5/1989 ............. G06F 13/10
(Continued)

OTHER PUBLICATIONS

ISA/EP; English language translation of International Preliminary Report on Patentability (Chapter 1); issued by WIPO Feb. 19, 2013; 11 pp.

(Continued)

*Primary Examiner* — Paul R Myers
(74) *Attorney, Agent, or Firm* — Harness, Dickey & Pierce, P.L.C.

(57) ABSTRACT

A bus-based control system comprises a plurality of bus subscribers which are connected to one another by means of a communication medium. The bus subscribers are assigned logical subscriber addresses. Next, the assigned subscriber addresses are verified. For this purpose, the bus subscribers use a defined mathematical operation to calculate a common first check value which is compared with a second check value. The mathematical operation begins with a defined starting value and comprises a number of operation steps which use a number of defined operands. Each of the subscriber addresses to be verified forms a different operand, and each bus subscriber executes at least one operation step.

18 Claims, 3 Drawing Sheets

(51) Int. Cl.

| | |
|---|---|
| ***G06F 13/42*** | (2006.01) |
| ***H04L 29/12*** | (2006.01) |
| *H03M 13/09* | (2006.01) |

(56) References Cited

U.S. PATENT DOCUMENTS

| | | | | |
|---|---|---|---|---|
| 6,700,877 | B1 | 3/2004 | Lorenz et al. | |
| 7,035,915 | B1 * | 4/2006 | Huo et al. | 709/219 |
| 2002/0083246 | A1 * | 6/2002 | Rupp et al. | 710/107 |
| 2002/0138668 | A1 * | 9/2002 | Heckel | 710/4 |
| 2005/0027883 | A1 * | 2/2005 | Carrier | 709/245 |
| 2006/0045097 | A1 * | 3/2006 | Kynast et al. | 370/395.54 |
| 2006/0045119 | A1 * | 3/2006 | Kynast et al. | 370/452 |
| 2008/0104294 | A1 * | 5/2008 | Huck et al. | 710/109 |
| 2009/0235124 | A1 | 9/2009 | Schmidt | |
| 2010/0280786 | A1 * | 11/2010 | Gorbold et al. | 702/120 |
| 2011/0279231 | A1 | 11/2011 | Schwenkel | |

FOREIGN PATENT DOCUMENTS

| | | | | |
|---|---|---|---|---|
| DE | 197 33 906 | A1 | 2/1999 | |
| DE | 199 34 514 | C1 | 2/2001 | |
| DE | 199 40 874 | A1 | 3/2001 | |
| DE | 10 2007 011 144 | A1 | 9/2008 | |
| DE | 10 2008 060 007 | A1 | 5/2010 | |
| EP | 2244146 | A1 * | 10/2010 | G05B 19/418 |
| JP | 2008-539622 | A | 11/2008 | |
| WO | WO2004/095300 | A1 | 11/2004 | |
| WO | WO2006/114314 | A1 | 11/2006 | |

OTHER PUBLICATIONS

Chinese Search Report for Appln No. 201180050314.7; Dec. 4, 2014; 2 pp.

* cited by examiner

METHOD FOR ALLOCATING SUBSCRIBER ADDRESSES TO BUS SUBSCRIBERS OF A BUS-BASED CONTROL SYSTEM

CROSS-REFERENCES TO RELATED APPLICATIONS

This application is a continuation of international patent application PCT/EP2011/063416 filed on Aug. 4, 2011 designating the U.S., which international patent application has been published in German language and claims priority from German patent application DE 10 2010 035 771.5 filed on Aug. 19, 2010. The entire contents of these priority applications are incorporated herein by reference.

BACKGROUND OF THE INVENTION

The present invention relates to a method for allocating subscriber addresses to bus subscribers in a bus-based control system for the automated control of a technical process. The invention also relates to a bus-based control system for the automated control of a technical process that uses such a method.

A bus system is a communication network which is set up specifically to allow data communication between a plurality of what are known as bus subscribers and a central station, if appropriate. Typically, bus systems are used in order to allow cyclic data communication between controllers and I/O devices which are physically remote from one another. The I/O devices have inputs and/or outputs which are used to receive signals from remote sensors and to actuate remote actuators, respectively. Controllers process input data corresponding to the signals from the sensors and produce output data from which the I/O devices produce the output signals for the actuators. The use of bus systems allows a plurality of sensors and actuators to be arranged physically away from one or more controllers with limited cabling complexity.

There are numerous variants of bus systems which have been developed for different requirements. In many cases, the bus subscribers each require an individual subscriber address so that the messages transmitted by means of the communication medium can be associated with the desired receiver, and to some extent also in order to identify the respective sender of the message. The subscriber addresses are usually allocated in a configuration mode before the bus system is put into operation.

Various methods for allocating subscriber addresses are known. One method involves providing the individual bus subscribers with address selector switches, wherein the respective subscriber address is set on the bus subscriber itself by using the respective address selector switch. Such an approach has the disadvantage that a subscriber address can be allocated only at the location of the respective bus subscriber. Central configuration of the bus system is not possible.

There are therefore numerous methods which can be used to assign addresses to bus subscribers in a bus system from a central station via the bus system itself. One such method is described in DE 197 33 906 A1, for example. In this case, the address allocation is based on different distances between the bus subscribers and what is known as the master station, which allocates the subscriber addresses, and also on the resultant different message transfer times. The method is used to assign a respective individual subscriber address to a plurality of bus subscribers one after the other. However, the known method is not suitable for the allocation of subscriber addresses in a bus system which is intended to be used for transmitting safety-related data in terms of European standards EN 954-1, IEC/EN 61508 and EN ISO 13849-1. These standards define requirements for the design and implementation of machines and machine installations which may present a hazard to persons during operation. If, by way of example, the bus system is intended to be used to transmit an enable signal from an emergency off pushbutton or a safety light barrier to a controller or a shutdown signal for an electric drive, it is necessary to ensure that the respective messages come from the correct sender and also reach the correct receiver. An erroneous address assignment can have fatal consequences, for example if an incorrect machine is shut down when a safety light barrier is broken, and therefore a hazardous machine continues to run.

For a bus system which is intended to be used to control safety-related events within the terms of the aforementioned standards, the address allocation needs to be failsafe. In this context, "failsafe" means that at least the requirements of category 3 of European standard EN 954-1 and/or the requirements according to SIL2 of IEC/EN 61508 or comparable requirements are met. A possible error in the allocation of the addresses must accordingly not result in the controlled installation entering a state which presents a hazard to a user or another person.

DE 199 34 514 C1 discloses a method for allocating subscriber addresses to bus subscribers in a control system, in which the individual bus subscribers have an explicitly defined physical position as a result of the structure of the bus system. Each bus subscriber uses its explicit physical position to verify an assigned logical address. The method is particularly suitable for the allocation of subscriber addresses to bus subscribers on what is known as the Interbus, which has widely been used for the automation of technical processes in production environments. However, verifying an allocated subscriber address by using an actual physical position uses a particular property of the Interbus and therefore cannot be transferred to other bus systems without this particular property.

DE 199 40 874 A1 discloses another method for configuring a bus subscriber for a safety-oriented control system, wherein the bus subscriber is assigned a subscriber address. In this case, an unconfigured bus subscriber uses a predefined, explicitly stipulated universal address to register with a central station which is likewise connected to the bus system. The central station assigns the unconfigured bus subscriber a subscriber address which is verified by virtue of subsequent data traffic between the bus subscriber and the station. In this case, the central station monitors that only precisely one bus subscriber is configured in each case. This method is particularly suitable for configuring an individual bus subscriber which is used as a replacement device to replace a faulty bus subscriber on an already configured bus system. If a relatively large number of bus subscribers are intended to be assigned addresses, this method is very time-consuming, however.

SUMMARY OF THE INVENTION

Against this background, it is an object of the present invention to provide an alternative method for the failsafe allocation of subscriber addresses to bus subscribers in a bus-based control system.

According to one aspect of the invention, there is provided a method for allocating subscriber addresses to bus subscribers in a bus-based control system for the automated control of a technical process, the method comprising the steps of providing a plurality of bus subscribers which are connected to one another by means of a communication medium, assigning logical subscriber addresses to the bus subscribers, and verifying the assigned logical subscriber addresses, wherein the bus subscribers use a defined mathematical operation to calculate a common first check value which is compared with a second check value in order to verify the assigned logical subscriber addresses, wherein the mathematical operation begins with a defined starting value and comprises a number of operation steps which use a number of defined operands, wherein each of the subscriber addresses to be verified forms a different operand, and wherein each bus subscriber executes at least one operation step.

According to another aspect of the invention, there is provided a control system for the automated control of a technical process, comprising a plurality of bus subscribers which are connected to one another by means of a communication medium, wherein the bus subscribers have assigned logical subscriber addresses, and comprising a station designed to verify the assigned logical subscriber addresses, wherein the bus subscribers are designed to use a defined mathematical operation to calculate a common first check value which is compared in the station with a second check value in order to verify the assigned logical subscriber addresses, wherein the mathematical operation beings with a defined starting value and comprises a number of operation steps which use a number of defined operands, wherein each of the subscriber addresses to be verified forms a different operand, and wherein each bus subscriber is designed to perform at least one operation step.

Preferably, the station is a control unit of the control system, and the bus subscribers are I/O units which interchange data representing input signals from sensors and output signals for actuators with the control unit.

The novel method and the novel control system use a defined mathematical algorithm which is used to calculate a first check value by executing a plurality of sequentially successive operation steps. The first check value is dependent on all the subscriber addresses to be verified and is jointly calculated in separate substeps by all the bus subscribers which have been assigned a subscriber address to be verified. Preferably, each bus subscriber "knows" only precisely that operation step (or those operations steps) from the mathematical operation which the bus subscriber needs to execute in the course of the physically distributed operation steps. In other words, it is preferred if no bus subscriber (apart from the station which verifies the subscriber addresses) knows all of the operation steps and/or operands which are used for the verification. The reason is that in this case all the bus subscribers are inevitably required for the verification.

It is also preferred if the first check value is a numerical value which is uniquely obtained from the allocated subscriber addresses, i.e. the result of the mathematical operation delivers precisely one individual check value for each combination of subscriber addresses.

The novel method and the novel control system allow quick and reliable checking of the address assignment. It is possible to check any number of subscriber addresses in one verification process. Therefore, the novel method and the novel bus system allow configuration of a plurality of bus subscribers in one configuration pass. Furthermore, the novel method and the novel control system are largely independent of the physical structure of the bus system. In particular, the novel method can be used in the case of bus systems in which the actual physical position of the individual bus subscribers is unknown or cannot be uniquely determined on the communication medium. The novel method can also be used in cases in which the subscriber addresses are allocated to the individual bus subscribers in an arbitrary order and/or structure, with the result that there are no significant restrictions in terms of the addresses to be allocated.

Secondly, the novel method and the novel control system provide the advantage that subscriber addresses can be allocated and verified in a failsafe manner via the bus system itself. Therefore, the aforementioned object is completely achieved.

In a preferred refinement of the invention, each bus subscriber performs at least one operation step in which the subscriber address assigned to the bus subscriber forms the operand.

In this refinement, each bus subscriber calculates "its" operation step using "its" subscriber address. Alternatively, other refinements of the invention allow the bus subscribers to perform the distributed operation steps using respective "foreign" subscriber addresses, i.e. each bus subscriber calculates an operation step using a subscriber address which is assigned to another bus subscriber. In the preferred refinement, however, the verification can be performed more simply and more quickly, since the individual bus subscribers already know the subscriber address assigned to them. In both variants, the number of operation steps is at least equal to the number of bus subscribers.

In a further refinement, the subscriber addresses are assigned to the bus subscribers from a central station, wherein the central station calculates the second check value independently of the bus subscribers using the same mathematical operation, the same starting value and the same operands.

In this refinement, the central station knows all the subscriber addresses which have been assigned to the individual bus subscribers. It can therefore readily perform a control calculation. The calculation of the second check value using the same mathematical operation, the same starting value and the same operands allows very simple verification by virtue of the first and the second check values being compared with one another for identity. If the two values differ from one another, the verification has failed, and, preferably, the address allocation is repeated. Since the two check values are calculated independently of one another, but using the same mathematical operation, the same starting value and the same operands, this refinement provides a very reliable check.

In a further refinement, the central station is connected to the bus subscribers by means of the communication medium, and it obtains the common first check value via the communication medium.

In preferred variants of this refinement, the central station is what is known as a bus master, i.e. a bus subscriber which has special rights and/or capabilities in comparison with the other bus subscribers. Typically, the bus master controls and/or organizes the communication of the bus subscribers via the communication medium, for example by initiating communication cycles, providing time slots and/or data fields for the data from the individual bus subscribers and/or ensuring arbitration in another way. The refinement has the advantage that the address allocation is possible on the bus system itself. The implementation of the function of the central station in a bus master is furthermore advantageous because a bus master is typically present only once on the bus system and often provides a higher level of intelligence and/or computation power in comparison with other bus subscribers. The function of the central station can therefore be accommodated in a bus master very cheaply and efficiently.

In a further refinement, the central station is of failsafe design.

As already indicated further above, "failsafe" means that at least single-error safety according to category 3 of EN 954-1 or comparable requirements are met. The safety of the system must not be lost even if one error occurs. Typically, the central station has multichannel redundancy in this refinement in order to achieve the single-error safety. However, there may also be single-channel implementations which meet said requirements. It is also particularly preferred if the (further) bus subscribers which are assigned subscriber addresses are of nonfailsafe design, since the novel method according to this refinement allows failsafe allocation of subscriber addresses even in such cases. The refinement is particularly advantageous if the central station acts as a bus master on the bus system, because in that case only an intelligent, failsafe station is required and the further bus subscribers can be implemented comparatively simply and cheaply.

In a further refinement, the bus subscribers are connected in a logical order by means of the communication medium, wherein the logical order has a first bus subscriber, at least one second bus subscriber and a last bus subscriber.

In some preferred exemplary embodiments, the logical order of the bus subscribers corresponds to the order of data in a predefined data frame which is forwarded from one bus subscriber to another in the fashion of a bucket chain in order to allow the bus subscribers to communicate with one another and/or with the bus master. In particularly preferred exemplary embodiments, the bus master generates such a data frame in predefined, repeated intervals of time. The data frame is forwarded from one bus subscriber to another until it finally reaches the bus master again.

In this refinement, the bus system is particularly suitable for collecting input data which represent sensor signals from a plurality of sensors and for outputting control commands to the actuators of a distributed control system. The logical order of the bus subscribers allows predefined cycle times and also simple and cheap implementation. Furthermore, such a bus system is very well suited to the automated allocation of subscriber addresses, wherein the novel method for verifying the allocated addresses can advantageously be used. In this case, it is particularly advantageous if a mathematical operation does not comply with the associative law, because in that case not only the allocated subscriber addresses but also the order of the bus subscribers are verified, as explained further below with reference to an exemplary embodiment.

In a further refinement, the first bus subscriber executes a first operation step which uses the starting value and a first operand in order to determine a first intermediate value, wherein the first bus subscriber sends the first intermediate value to the second bus subscriber, and wherein the second bus subscriber executes a second operation step in which the first intermediate value and a second operand are used in order to determine a second intermediate value. Preferably, the last bus subscriber executes a last operation step, wherein the second intermediate value and a last operand are used.

In this refinement, the bus subscribers calculate the first check value in the same logical order in which they are connected to one another by means of the communication medium. As a result of the allocated subscriber addresses, the logical order may differ from the physical structure in which the bus subscribers are connected to the communication medium. However, the logical order may also be identical to the physical structure. The refinement allows a very simple and cheap implementation of the novel method, and it allows very quick verification of the allocated subscriber addresses, since the intermediate values are each sent to the subsequent bus subscriber directly for further use.

In a further refinement, the last bus subscriber calculates the common first check value using the last operation step. As an alternative, another refinement allows the last bus subscriber to use the last operation step to determine a further intermediate value which is used to calculate the first check value in further operation steps.

The former refinement has the advantage that the first check value is available quickly after a small number of operation steps. Accordingly, the subscriber addresses can be verified quickly. By contrast, the latter refinement has the advantage that the first check value may contain further check steps and/or calculation steps. This can be advantageously used to verify further configuration data from the bus system which are independent of the individual bus subscribers. Secondly, the first check value can advantageously be conditioned and/or altered in a manner which facilitates the comparison with the second check value.

In a further refinement, the operation steps are performed in a defined order of operation steps, wherein the first check value varies depending on the defined order of operation steps.

In this refinement, the mathematical operation delivers different results depending on the order of the operation steps performed, even if the starting value and the operands are the same in each case. Preferably, a mathematical operation is chosen which complies neither with the associative law nor with the communicative law. The refinement has the advantage already indicated further above that not only the allocated subscriber addresses but also the order of the bus subscribers themselves are verified. This is particularly advantageous when the bus system is used for transmitting safety-critical data, since the switching of two subscribers of the same type is difficult to recognize on the one hand, but can easily happen and can result in serious consequences on the other hand.

In a further refinement, the mathematical operation is a checksum calculation, particularly a CRC checksum calculation, which is based on polynomial division. In particularly preferred exemplary embodiments, the mathematical operation is a CRC-8, CRC-16 or CRC-32 checksum calculation.

The abbreviation CRC stands for cyclic redundancy check. This is a defined method for calculating a check value for data. Usually, CRC checksums are calculated in order to be able to recognize errors during the transmission or storage of data. As a rule, the calculated CRC checksum is then transmitted or stored together with the protected data. In the present refinement, the same algorithm is used in order to calculate a check value which makes it possible to check the success of the address allocation, in a separate verification step after data transmission has taken place, namely after the allocation of the subscriber addresses. The use of the CRC algorithm allows very cheap and failsafe implementation. Depending on the number and length of the allocated subscriber addresses, it is advantageous to use a shorter or longer checksum (CRC-8, CRC-16, CRC-32, etc.).

In a further refinement, the control system is put into operation following successful verification, wherein the first check value is repeatedly calculated during the operation of the control system. Preferably, the first check value is calculated during defined intervals of time during the operation of the control system. Furthermore, it is preferred if the master varies the starting value for repeated calculation of the first check value. This refinement allows simple and quick verification of the configured bus subscribers during the operation of the bus system, so that it is possible to quickly recognize a change on account of a memory error, cable pinching or on account of a change on the bus subscribers, for example. This refinement advantageously contributes to a further increase in failsafety.

In a further refinement, the operands also represent device-specific properties of the bus subscribers, such as a serial number, a device type and/or a firmware level for the respective bus subscribers.

This refinement advantageously monitors not only the allocated subscriber addresses but also individual properties of the bus subscribers. The refinement therefore contributes to a further increase in failsafety.

In a further refinement, the first check value is calculated for a number of bus subscribers which is smaller or greater than the plurality of the bus subscribers which are connected by means of the communication medium.

In this refinement, the first check value is deliberately calculated using a number of bus subscribers which differs from the number of subscriber addresses to be verified in total. In preferred exemplary embodiments, the number of bus subscribers to be verified can be selected individually. Preferably, the verification is carried out for a reduced number of bus subscribers following verification of all the allocated addresses. Furthermore, it is advantageous if the bus subscribers to be verified can be selected individually. The refinement allows specific and convenient diagnosis for those cases in which verification of the allocated subscriber addresses over the plurality of bus subscribers fails. Since the first check value is jointly calculated by all the bus subscribers for which the addresses are verified, the novel method initially delivers only a blanket statement about whether the allocation of the subscriber addresses has worked flawlessly as a whole. Individual error analysis is difficult using the check value calculated over all the bus subscribers, however. Deliberately reducing the number of bus subscribers to be verified allows a source of error to be identified. Furthermore, verification of a subscriber address which has actually not been allocated makes it possible to test whether there are still further bus subscribers connected to the communication medium without this being recognized. The preferred refinement thus facilitates individual diagnosis.

It goes without saying that the features cited above and those which are yet to be explained below can be used not only in the respectively indicated combination but also in other combinations or on their own without departing from the scope of the present invention.

BRIEF DESCRIPTION OF THE DRAWINGS

Exemplary embodiments of the invention are shown in the drawing and are explained in more detail in the description below. In the drawing.

DESCRIPTION OF PREFERRED EMBODIMENTS

Figure 1:
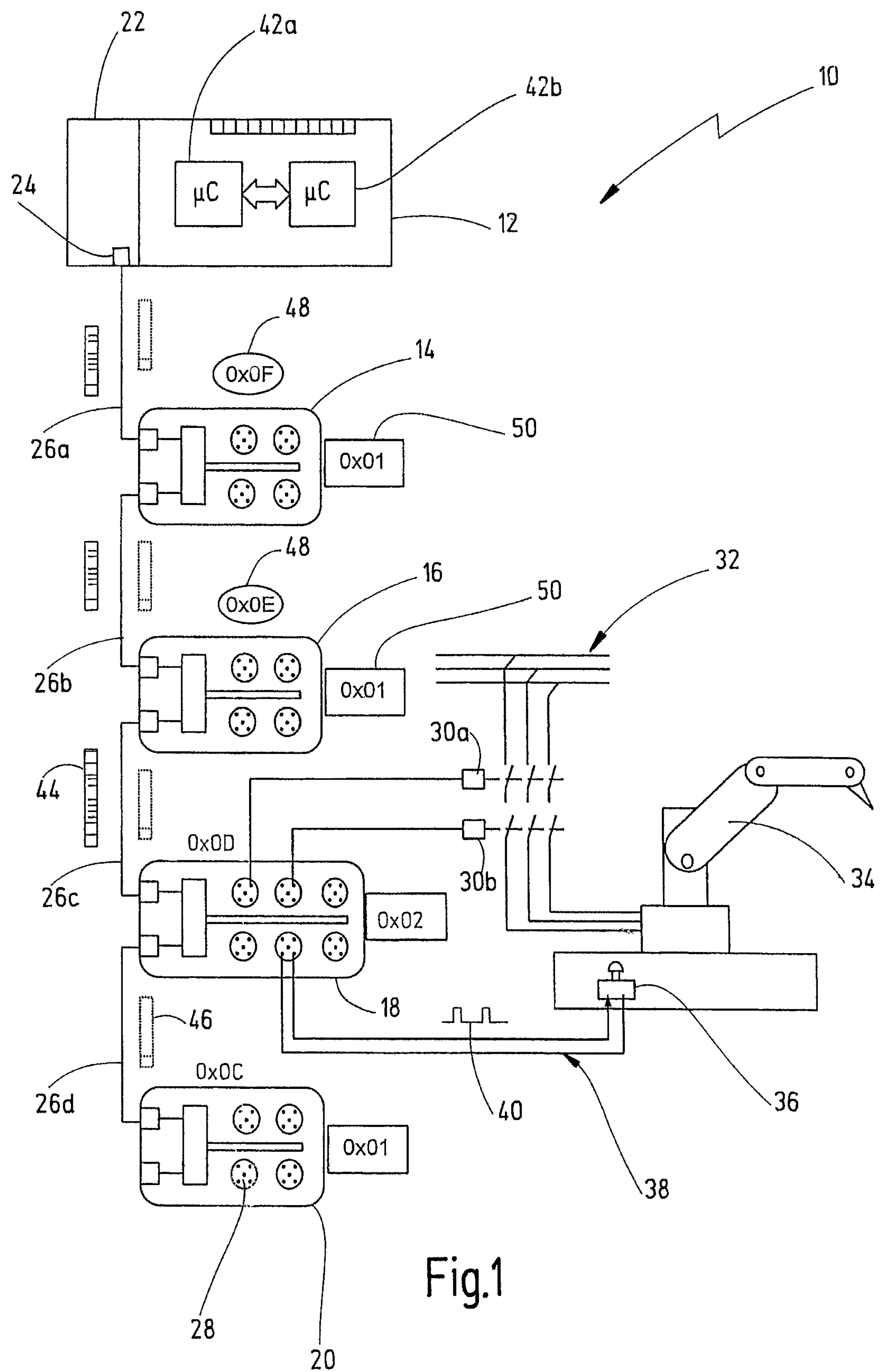
FIG. 1 shows a schematic illustration of an exemplary embodiment of the novel control system.

In FIG. 1, a control system on which the novel method is implemented is denoted as a whole by reference numeral 10. The control system 10 comprises a control unit 12 and a number of I/O units 14, 16, 18, 20. In this case, the control unit 12 has an integrated or plugged-in bus module 22 with a bus interface 24. The bus interface 24 has a bus line 26*a* connected to it which leads to a first bus interface 24 on the I/O unit 14. The I/O unit 14 has a second bus interface, from which a further bus line 26*b* leads to first bus interface of the I/O unit 16. From a further bus interface of the I/O unit 16, a further bus line 26*c* leads to a first bus interface of the I/O unit 18. From a further bus interface of the I/O unit 18, a further bus line 26*d* leads to a first bus interface of the I/O unit 20. The I/O units 14 to 20 are thus connected to the bus module 22 of the control unit 12 in a series. The control unit 12 with the bus module 22, the I/O units 14 to 20 and the bus lines 26*a* to 26*d* together form a bus system which is part of the control system 10 and which allows the communication between the control unit 12 and the I/O units. In this case, the I/O units 14 to 20 are bus subscribers within the meaning of the present invention. The control unit 12 with the bus module 22 has the function of a bus master in this case, which bus muster is also used to initiate the allocation and verification of subscriber addresses.

The series arrangement of the bus subscribers on a bus master, as it is illustrated here, corresponds to a preferred exemplary embodiment. The invention is not limited thereto, however, and can also be used for bus systems having other topologies, such as a ring, star or tree topology. In principle, the novel method and the novel bus system can also be implemented without a bus master, such as for bus systems in which the bus subscribers are able to send and/or receive at any time.

Each I/O unit 14 to 20 has a number of connector sockets for connecting sensors and/or actuators. By way of example, a connector socket on the I/O unit 20 is denoted by the reference numeral 28.

In this case, by way of example, two contactors 30*a*, 30*b* are connected to two connector sockets of the I/O unit 18. The contactors 30*a*, 30*b* are actuators which the control system 10 uses to generate control signals for controlling a technical process. Each contactor 30*a*, 30*b* has a number of make contacts. A respective make contact of each contactor 30*a*, 30*b* is arranged in series between a power supply 32 and an installation 34 that is to be controlled. By way of example, the installation 34 shown here is a robot. The contactors 30*a*, 30*b* can be used to isolate the robot 34 from power supply 32.

The reference numeral 36 denotes an emergency off pushbutton which is connected to a further connector socket of the I/O unit 18 by means of a line pair 38. The I/O unit 18 produces a clock signal 40 having a defined clock period on an outgoing line to the emergency off pushbutton 36. The clock signal 40 is returned to the I/O unit 18 via the emergency off pushbutton 36 and a return line of the line pair 38. The emergency off pushbutton 36 is a preferred example of a signaling device or a sensor which delivers an input signal evaluated by the control unit 12. On the basis of the input signal, the control unit 12 generates the control signals for the contactors 30*a*, 30*b*.

In this case, the contactors 30*a*, 30*b* and the emergency off pushbutton switch 36 are examples of actuators and sensors. Other preferred sensors are safety light barriers, guard door switches, two-hand switches or else sensors which measure variables such as temperature, pressure, position, speed, etc. Furthermore, solenoid valves, electric drives and more can be connected to the I/O units 14 to 20 as actuators.

For the sake of simplicity, FIG. 1 shows only a control system 10 for protecting the robot 34, but not a control system which controls the operation of the robot 34. In principle, both control systems may be identical, i.e. the control system 10 controls both the operating cycle and the safety-relevant monitoring functions. In many cases, however, a separate control system has been used for the safety functions to date, since the demands on the inherent failsafety of the control system are much higher for the safety functions than for the control of the operating cycles. On the other hand, the control of an operating cycle often requires a higher level of computational power than the control of the safety functions.

For controlling the safety functions, the control unit 12 is typically designed with multichannel redundancy, which is shown symbolically in FIG. 1 by means of two microprocessors 42a, 42b which monitor one another and/or interchange their results. Instead of microprocessors, it is also possible to use other programmable logic circuits, such as microcontrollers, FPGAs, ASICs and more. In some preferred exemplary embodiments, the programmable circuits 42a, 42b execute redundant calculation of the (second) check value, which is used to verify the allocation of subscriber addresses to the I/O units 14 to 20 on the basis of the novel method in failsafe fashion.

The control unit 12 communicates with the I/O units 14 to 20 by using the bus module 22 to send data messages 44 and to receive response messages 46 from the I/O units 14 to 20. In one preferred exemplary embodiment, the data and response messages are interchanged on the basis of a method as described in DE 10 2008 060 007 A1. Accordingly, this document is included here by way of reference for the details of the data transmission. The novel method for verifying subscriber addresses is not limited to the preferred data transmission method, however, and can also be used for other bus protocols in which subscriber addresses are used.

In the present case, the I/O units 14 to 20 each obtain an individual subscriber address 48 from the control unit 12. By way of example, the I/O unit 14 in this case has an assigned subscriber address 0x0F, the I/O unit 16 has an assigned subscriber address 0x0E, the I/O unit 18 has an assigned subscriber address 0x0D and the I/O unit 20 has an assigned subscriber address 0x0C. In preferred exemplary embodiments, the addresses are assigned in a configuration mode before the control system 10 is put into operation, by virtue of the control unit 12 sending data messages 44 via the bus interface 24, said data messages each containing a subscriber address 48. Each I/O unit which has already been assigned a subscriber address forwards such a data message to the next I/O unit in the series arrangement. An I/O unit which has not yet been assigned an address extracts the address contained in such a data message as an assigned address. Hence, the I/O units 14 to 20 can be "baptized" by the control unit 12 one after the other. Next, the control unit 12 verifies the allocated subscriber addresses on the basis of a method as explained below with reference to FIG. 2.

In this case, reference numeral 50 indicates specific subscriber data which are representative of the respective bus subscriber 14, 16, 18, 20. By way of example, they are an individual serial number, a device type number, a firmware level, inter alia. In the exemplary embodiment shown, the bus subscribers 14, 16 and 20 have the device type number 0x01, while the bus subscriber 18 has the device type number 0x02.

Figure 2:
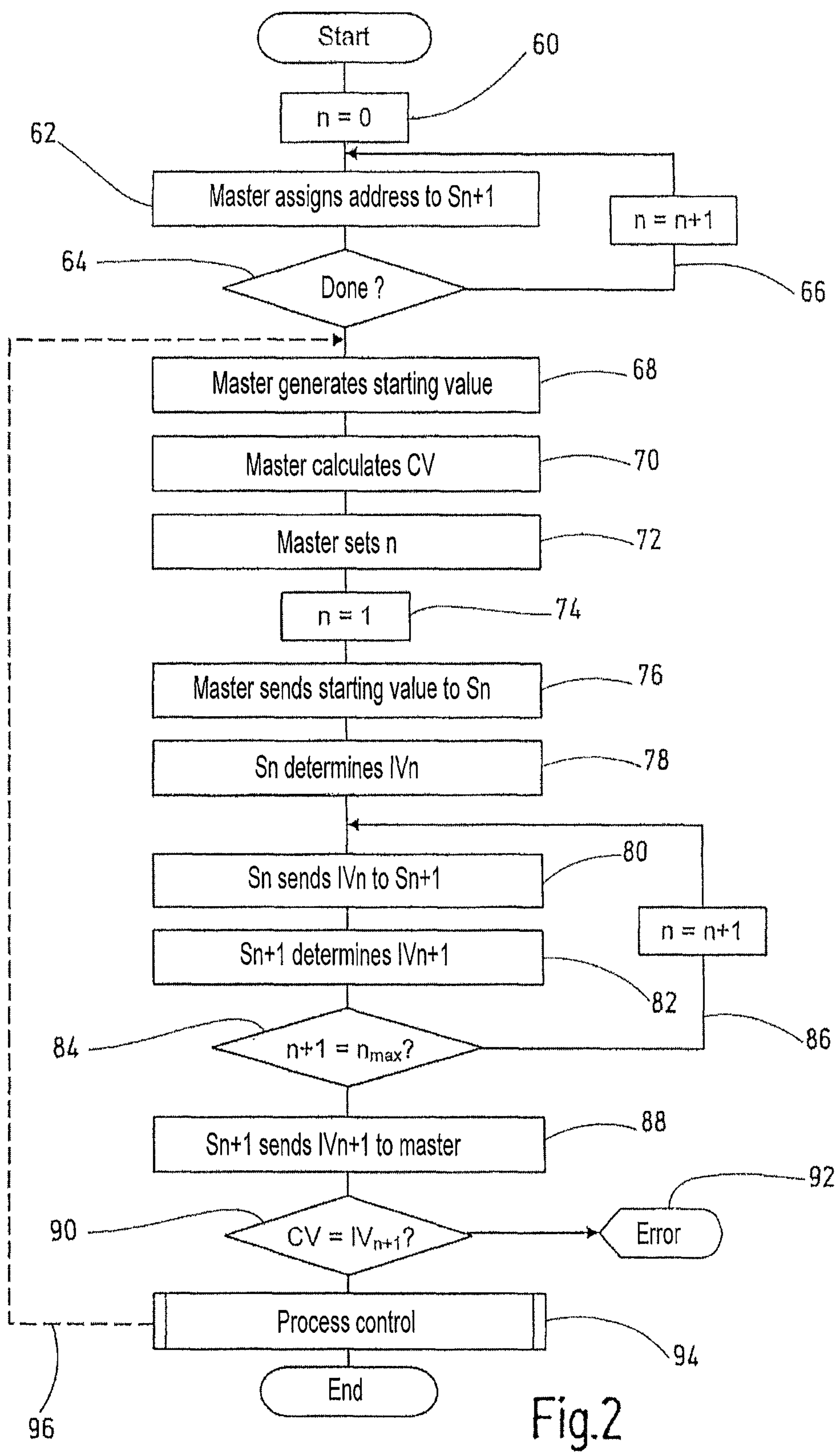
FIG. 2 shows a flowchart to explain a preferred exemplary embodiment of the novel method.

According to FIG. 2, a count variable n=0 is first of all set in step 60. According to step 62, the bus master, i.e. the control unit 12 in this case, then allocates a subscriber address to a first bus subscriber, which is denoted generally as $S_{n+1}$ in FIG. 2. For the control system 10 in FIG. 1, the first bus subscriber is the I/O unit 14, which obtains the subscriber address 0x0F from the control unit 12. In step 64, a test is performed to determine whether further addresses need to be allocated to further bus subscribers. If this is the case, the method returns to step 62 in line with loop 66, with the count variable n being incremented by 1.

When all the subscriber addresses have been allocated, the preferred verification begins by virtue of the bus master producing a starting value according to step 68. In preferred exemplary embodiments, the starting value is a numerical value from a numerical range from which the allocated subscriber addresses also stem. By way of example, it is assumed that the starting value is 0x7A in this case.

Furthermore, it is assumed by way of example that the master uses a CRC-8 checksum calculation with the generator polynomial $x^8+x^5+x^4+x^1$ as mathematical operation. The master thus calculates the CRC-8 with the starting value 0x7A using the data (subscriber addresses) 0x0F, 0x0E, 0x0D and 0x0C. The result is the check value CV=0xF7. A more detailed description of the CRC-8 checksum algorithm can be found in the relevant specialist literature and also on Wikipedia, for example, at the address http://en.wikipdia.org/wiki/Cyclic_redundancy_check. Said Wikipedia article is included here by way of reference.

In step 72, the master sets a value $n_{max}$ which specifies the number of subscriber addresses to be verified. By choosing a value which is smaller than the number of bus subscribers connected to the bus system 10 in total, the master can limit the verification to a reduced number of bus subscribers. First of all, it should be assumed that the master sets $n_{max}$=4, i.e. it performs the verification over all the I/O units 14 to 20.

In the next step 74, a count variable n=1 is set again. Next, the master sends the starting value 0x7A to the bus subscriber $s_1$, i.e. the I/O unit 14, according to step 76. The bus subscriber $S_1$ calculates a first intermediate value $IV_1$ by using the starting value 0x7A to calculate a CRC-8 checksum for its own address 0x0F. In this case, the intermediate result $IV_1$ is 0x0D.

According to step 80, the bus subscriber $S_1$ sends the first intermediate value $IV_1$ to the next bus subscriber $S_2$. The latter calculates a further intermediate value $IV_{n+1}$ by using the received intermediate value $IV_1$=0x0D as a starting value and using its own address 0x0E as an operand. The second intermediate value $IV_2$ is 0x53 in this case.

According to step 84, the second bus subscriber checks whether it is the last in a series of the bus subscribers to be verified. In the present case, there are still two bus subscribers (I/O units 18 and 20) to come, which means that two further operation steps in the two further bus subscribers 18 and 20 are executed in line with loop 86. In the example assumed, the third bus subscriber (I/O unit 18) obtains the second intermediate value $IV_2$=0x53 as a starting value, and it uses its own subscriber address 0x0D to calculate a third intermediate value $IV_3$=0x61. The fourth bus subscriber (I/O unit 20) receives the intermediate value $IV_3$=0x61 as a starting value and uses its subscriber address 0x0C to calculate a further intermediate value $IV_4$=0xF7. Since there is no further bus subscriber to come in the series, the I/O unit 20 returns the intermediate value $IV_4$ to the bus master 12 as a first check value (step 88).

According to step 90, the bus master or the control unit 12 checks whether the received check value $IV_4$ is the same as the previously calculated check value CV. If the two check values differ from one another, there is an error in the address allocation and/or verification. Accordingly, the control unit 12 generates an error signal according to step 92. If the two check values are identical, on the other hand, this is an indication that the address assignment has taken place without any errors. The control system 10 can now change to the control mode, which is indicated by step 94.

In preferred exemplary embodiments, the verification of the allocated addresses is repeated at defined times during the process control, as indicated by the loop 96.

In one variant of this exemplary embodiment, not only the previously allocated subscriber addresses but also the subscriber-specific data 50 are included in the verification. The control unit 12 now calculates the check value CV using the subscriber addresses and type codes 0x0F, 0x01, 0x0E, 0x01, 0x0D, 0x02, 0x0C, 0x01 and obtains the check value CV=0x62 as the result.

Figure 3:
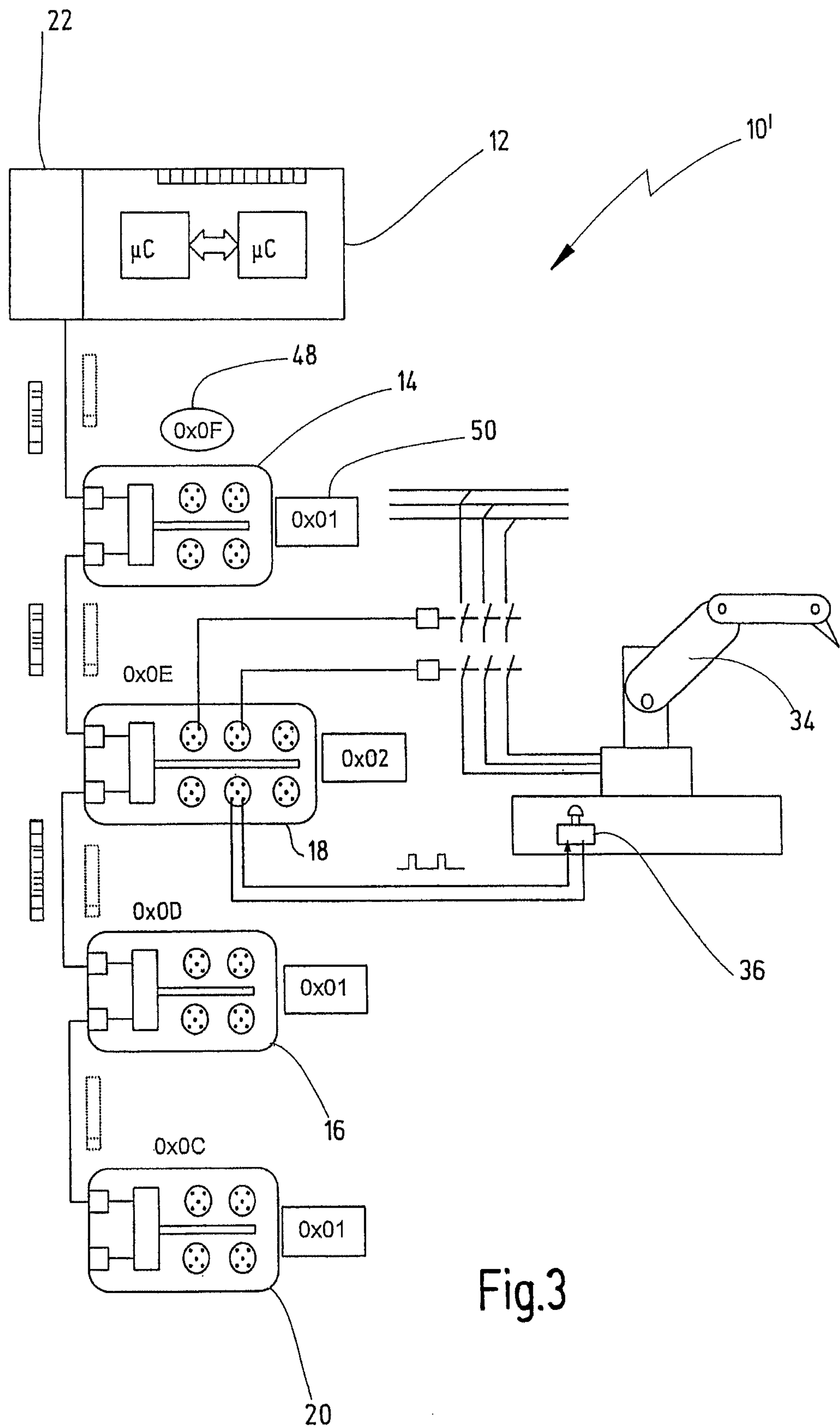
FIG. 3 shows the control system from FIG. 1, with two bus subscribers having been switched.

It will now be assumed that the I/O units 16 and 18 have been subsequently switched, as shown in FIG. 3. The I/O unit 14 now receives the starting value 0x7A and uses its own address 0x0F and the device type 0x01 to calculate a first intermediate value $IV_1$=0x7D. The (switched) I/O unit 18, as a second bus subscriber, now uses the starting values 0x7D, the assigned address 0x0E and the device type 0x02 to calculate the second intermediate value $IV_2$=0x74.

The third I/O unit uses the starting value 0x74, the assigned address 0x0D and the device type 0x01 to calculate the third intermediate value $IV_3$=0xC9. The fourth I/O unit uses the starting value 0xC9, the assigned address 0x0C and the device type 0x01 to calculate the fourth intermediate value 0xEC and returns this result as a (first) check value to the bus master. The comparison of the two check values CV=0x62 and $IV_4$=0xEC indicates that the actual configuration does not match the expected configuration, even though the allocation of the addresses, taken individually, was successful.

As already explained previously with reference to FIG. 2, the control unit 12 can identify the incorrectly configured bus subscriber by first of all performing the verification cycle only as far as the first I/O unit 14 and then extending it in steps by one further I/O unit at a time. As soon as it arrives at the switched I/O unit 18, the two check values differ from one another. Furthermore, the control unit 12 can initiate a verification pass for a number of bus subscribers which is greater than the number of the bus subscribers in the desired configuration, and/or it can specifically address in the verification pass a subscriber address that has actually not been allocated, so as in this way to check whether there are more bus subscribers connected to the communication medium than provided for. This is particularly advantageous in order to check whether a bus subscriber which, according to the desired configuration, has been removed from the communication medium is actually also absent.

In one variant of the exemplary embodiment described above, the novel method uses a CRC-16 checksum calculation, with the address and the type code of each bus subscriber being combined to form a 16-bit data value. In principle, other mathematical operations which are performed in a plurality of sequential steps and hence can be distributed over a number of bus subscribers, and which deliver an explicit result on the basis of the operands used and—preferably—on the basis of the order of the operation steps performed, are also suitable for the novel method.

What is claimed is:

1. A method for allocating subscriber addresses to bus subscribers in a bus-based control system for the automated control of a technical process, the method comprising the following steps:

providing a plurality of bus subscribers which are connected to one another by means of a communication medium, assigning logical subscriber addresses to the bus subscribers, and verifying the assigned logical subscriber addresses, wherein the bus subscribers use a defined mathematical operation to collectively calculate a common first check value which is compared with a second check value in order to verify the assigned logical subscriber addresses, wherein the collectively calculated mathematical operation begins with a defined starting value and comprises a number of operation steps which use a number of defined operands, wherein each of the subscriber addresses to be verified forms a different operand of said collectively calculated mathematical operation, and wherein each bus subscriber executes at least one operation step but less than all of said number of operation steps in said collectively calculated mathematical operation.

2. The method of claim 1, wherein each bus subscriber executes at least one operation step in which the subscriber address assigned to said bus subscriber forms the operand.

3. The method of claim 1, wherein the subscriber addresses are assigned to the bus subscribers from a central station, wherein the central station calculates the second check value independently of the bus subscribers using the same mathematical operation, the same starting value and the same operands.

4. The method of claim 3, wherein the central station is connected to the bus subscribers by means of the communication medium and obtains the common first check value via the communication medium.

5. The method of claim 3, wherein the central station is of failsafe design.

6. The method of claim 1, wherein the bus subscribers are connected in a logical order by means of the communication medium, wherein the logical order has a first bus subscriber, at least one second bus subscriber and a last bus subscriber.

7. The method of claim 6, wherein the first bus subscriber executes a first operation step which uses the starting value and a first operand in order to determine a first intermediate value, wherein the first bus subscriber sends the first intermediate value to the second bus subscriber, and wherein the second bus subscriber executes a second operation step in which the first intermediate value and a second operand are used in order to determine a second intermediate value.

8. The method of claim 7, wherein the last bus subscriber calculates the common first check value using the last operation step.

9. The method of claim 7, wherein the last bus subscriber uses the last operation step to determine a further intermediate value which is used to calculate the first check value in further operation steps.

10. The method of claim 1, wherein the operation steps are executed in a defined order of operation steps, wherein the first check value varies depending on the defined order of operation steps.

11. The method of claim 1, wherein the mathematical operation is a CRC checksum calculation.

12. The method of claim 1, wherein the control system is put into operation following successful verification, and wherein the first check value is repeatedly calculated during the operation of the control system.

13. The method of claim 1, wherein the operands further represent device-specific properties of the bus subscribers.

14. The method of claim 1, wherein the first check value is calculated for a number of bus subscribers which is smaller or greater than the number of the bus subscribers which are connected by means of the communication medium.

15. The method of claim 1, wherein the mathematical operation is selected to deliver a unique common first check value for any combination of subscriber addresses.

16. The method of claim 1, wherein the calculation of said common first check value requires all of said plurality of bus subscribers to have executed their respective at least one of said number of operation steps in said collectively calculated mathematical operation.

17. A control system for the automated control of a technical process, comprising:

a plurality of bus subscribers connected to one another by means of a communication medium, said the bus subscribers having assigned logical subscriber addresses, and a station designed to verify the assigned logical subscriber addresses, wherein the bus subscribers are designed to use a defined mathematical operation to collectively calculate a common first check value, wherein the station is designed to compare the common first check value with a second check value in order to verify the assigned logical subscriber addresses, wherein the collectively calculated mathematical operation begins with a defined starting value and comprises a number of operation steps which use a number of defined operands, wherein each of the subscriber addresses to be verified forms a different operand of said collectively calculated mathematical operation, and wherein each bus subscriber is designed to perform at least one operation step but less than all of said number of operation steps in said collectively calculated mathematical operation.

18. The control system of claim 17, wherein the calculation of said common first check value requires all of said plurality of bus subscribers to have executed their respective at least one of said number of operation steps in said collectively calculated mathematical operation.

* * * * *